United States Patent
Gudaitis et al.

(10) Patent No.: US 10,658,814 B2
(45) Date of Patent: May 19, 2020

(54) LASER DIODE PRIMING TO REDUCE LATENCY

(71) Applicant: Microsoft Technology Licensing, LLC, Redmond, WA (US)

(72) Inventors: Algird Michael Gudaitis, Fall City, WA (US); Raymond Kirk Price, Redmond, WA (US); Niranjan Achugundla Puttaswamy, San Jose, CA (US); Sheethal Somesh Nayak, San Francisco, CA (US); John Allen Tardif, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 11 days.

(21) Appl. No.: 15/791,329

(22) Filed: Oct. 23, 2017

(65) Prior Publication Data

US 2019/0123512 A1    Apr. 25, 2019

(51) Int. Cl.
*H01S 5/042* (2006.01)
*H04N 3/08* (2006.01)
(Continued)

(52) U.S. Cl.
CPC .......... *H01S 5/0427* (2013.01); *G02B 27/017* (2013.01); *G02B 27/0172* (2013.01);
(Continued)

(58) Field of Classification Search
CPC .. H04N 9/3129; H04N 9/3155; H04N 9/3144; H04N 3/08; H04N 9/14;
(Continued)

(56) References Cited

U.S. PATENT DOCUMENTS

| 5,990,923 A | 11/1999 | Morrison |
| 6,697,402 B2 | 2/2004 | Crawford |

(Continued)

FOREIGN PATENT DOCUMENTS

| CN | 202221868 U | 5/2012 |
| CN | 202258260 U | 5/2012 |

(Continued)

OTHER PUBLICATIONS

"EE 230: Optical Fiber Communication Lecture 9". University of California, Santa Cruz. Retrieved Sep. 15, 2017 Available at: https://www.google.com/url?sa=t&rct=j&q=&esrc=s&source=web&cd=1&ved=0ahUKEwiX3JvPoKjWAhXFyVQKHUmPBiMQFggmMAA&url=https%3A%2F%2Fclasses.soe.ucsc.edu%2Fee230%2FSpring04%2FLecture%25209.opt&usg=AFQjCNHJKewmg8RAOCEHgccW1PETIkYOJg.

(Continued)

*Primary Examiner* — Jefferey F Harold
*Assistant Examiner* — Omer Khalid
(74) *Attorney, Agent, or Firm* — Alleman Hall Creasman & Tuttle LLP (57) ABSTRACT

A modulated light source comprises a laser diode and a drive circuit coupled operatively to the laser diode. The laser diode is configured to lase upon passing an above-threshold current for an accumulation period. The drive circuit is configured to draw a priming current through the laser diode over a priming period, the priming current being insufficient to cause the laser diode to lase during the priming period, but sufficient to shorten the accumulation period. The drive circuit is further configured to draw the above-threshold current through the laser diode after the priming period, thereby triggering emission from the laser diode following a shortened accumulation period.

20 Claims, 9 Drawing Sheets

(51) Int. Cl.
  *H01S 5/40* (2006.01)
  *H04N 9/14* (2006.01)
  *G02B 27/01* (2006.01)
  *G09G 3/02* (2006.01)
  *G09G 3/34* (2006.01)

(52) U.S. Cl.
  CPC ........... *G09G 3/025* (2013.01); *H01S 5/4093* (2013.01); *H04N 3/08* (2013.01); *H04N 9/14* (2013.01); *G02B 2027/0112* (2013.01); *G09G 3/346* (2013.01); *G09G 2230/00* (2013.01); *G09G 2320/0252* (2013.01); *G09G 2320/064* (2013.01); *G09G 2320/0633* (2013.01)

(58) Field of Classification Search
  CPC ................ G02B 27/01; G02B 27/0172; G02B 2027/0112; H01S 5/062; H01S 5/06808; H01S 5/06812; H01S 5/0427; H01S 5/4093; H05B 33/0806; G09G 3/025; G09G 3/346; G09G 2230/00; G09G 2320/0252; G09G 2320/0633; G09G 2320/064
  USPC ......................................................... 348/203
  See application file for complete search history.

(56) References Cited

U.S. PATENT DOCUMENTS

| | | | |
|---|---|---|---|
| 7,376,354 B2 | 5/2008 | White | |
| 7,812,666 B2 | 10/2010 | Chieng et al. | |
| 7,978,743 B2 | 7/2011 | Deppe et al. | |
| 8,125,704 B2 | 2/2012 | Mielke et al. | |
| 8,207,474 B2 | 6/2012 | Dane et al. | |
| 8,743,455 B2 | 6/2014 | Gusev et al. | |
| 8,750,341 B2 * | 6/2014 | Bazzani | H01S 5/06209 372/38.02 |
| 8,767,023 B2 | 7/2014 | Sakai et al. | |
| 9,130,344 B2 | 9/2015 | Stadler et al. | |
| 9,160,140 B2 | 10/2015 | Gusev et al. | |
| 9,531,931 B2 | 12/2016 | Patel et al. | |
| 2004/0202216 A1 | 10/2004 | Fairgrieve | |
| 2005/0168564 A1 | 8/2005 | Kawaguchi et al. | |
| 2008/0106493 A1 | 5/2008 | Lach et al. | |
| 2008/0225915 A1 | 9/2008 | Mccormack | |
| 2009/0175302 A1 | 7/2009 | Bazzani et al. | |
| 2009/0245302 A1 | 10/2009 | Baird et al. | |
| 2011/0241549 A1 | 10/2011 | Wootton | |
| 2012/0081009 A1 | 4/2012 | Shteynberg et al. | |
| 2014/0139603 A1 | 5/2014 | Fujita et al. | |
| 2014/0185643 A1 | 7/2014 | Mccomb et al. | |
| 2015/0378151 A1 * | 12/2015 | Nishioka | G02B 26/101 359/204.4 |
| 2016/0073069 A1 | 3/2016 | Xue | |
| 2016/0149376 A1 * | 5/2016 | Ritter | H02M 3/156 372/38.07 |
| 2016/0233643 A1 | 8/2016 | Fujimoto et al. | |
| 2017/0005465 A1 | 1/2017 | Wyland et al. | |
| 2017/0005574 A1 | 1/2017 | Wyland | |
| 2017/0054272 A1 | 2/2017 | Chiu et al. | |
| 2017/0099469 A1 | 4/2017 | Matsumoto et al. | |
| 2017/0118452 A1 | 4/2017 | Ogi et al. | |
| 2017/0214893 A1 | 7/2017 | Naftali et al. | |
| 2019/0157839 A1 | 5/2019 | Gudaitis et al. | |

FOREIGN PATENT DOCUMENTS

| | | |
|---|---|---|
| EP | 3163873 A1 | 5/2017 |
| WO | 2016128716 A1 | 8/2016 |

OTHER PUBLICATIONS

"Four-String, White LED Driver for LCD Backlight Applications", Retrieved From: http://www.analog.com/media/en/technical-documentation/data-sheets/ADD5207.pdf, 2009, 17 Pages.

"Integrated, 2-Channel, High-Brightness LED Driver with High-Voltage Boost and SEPIC Controller", Retrieved From: https://datasheets.maximintegrated.com/en/ds/MAX16838B.pdf, Retrieved on: Jun. 21, 2017, pp. 1-21.

"Methods of Controlling Laser Drivers: POTs and DACs", Retrieved From: https://www.maximintegrated.com/en/app-notes/index.mvp/id/1010, Mar. 26, 2002, 3 Pages.

"Pulsed Laser Diodes—PGA—PGEW Series", Retrieved From: https://www.pacer.co.uk/Assets/User/1779-Lasers_for_LRF.pdf, Retrieved on: Jun. 21, 2017, pp. 19-21.

"Non Final Office Action Issued in U.S. Appl. No. 15/820,356", dated Sep. 4, 2018, 8 Pages.

Holmgren, et al., "Scanned Laser Displays for Head Mounted Displays", Retrieved From: http://www.cs.unc.edu/techreports/92-029.pdf, Apr. 1990, pp. 1-16.

"International Search Report and Written Opinion Issued in PCT Application No. PCT/US2018/055763", dated Feb. 5, 2019, 15 Pages.

"International Search Report and Written Opinion Issued in PCT Application No. PCT/US18/055759", dated Feb. 12, 2019, 11 Pages.

* cited by examiner

LASER DIODE PRIMING TO REDUCE LATENCY

BACKGROUND

A laser diode is an electro-optical device in which an intrinsically-doped, direct-bandgap semiconductor zone separates opposing p- and n-doped zones. Under forward bias, the p- and n-doped zones inject charge carriers into the intrinsically-doped zone, which is configured as a laser cavity. When electrical current is injected into the diode laser, inverted population of electrons and holes accumulate within the quantum well of the laser diode. Some of the accumulated charge carriers may recombine by stimulated photon emission, causing a coherent, collimated beam to emerge from the laser cavity. A laser diode operated in a pulsed mode may be used in electronic-display applications.

SUMMARY

One aspect of this disclosure is directed to a modulated light source comprising a laser diode and a drive circuit coupled operatively to the laser diode. The laser diode lases upon passing an above-threshold current for an accumulation period. The drive circuit is configured to draw a priming current through the laser diode over a priming period, the priming current being insufficient to cause the laser diode to lase during the priming period, but sufficient to shorten the accumulation period. The drive circuit is further configured to draw the above-threshold current through the laser diode after the priming period, thereby triggering stimulated emission of light from the laser diode following a shortened accumulation period.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

This disclosure will now be presented by way of example and with reference to the drawing figures listed above. Components, process steps, and other elements that may be substantially the same in one or more of the figures are identified coordinately and are described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

Figure 1:
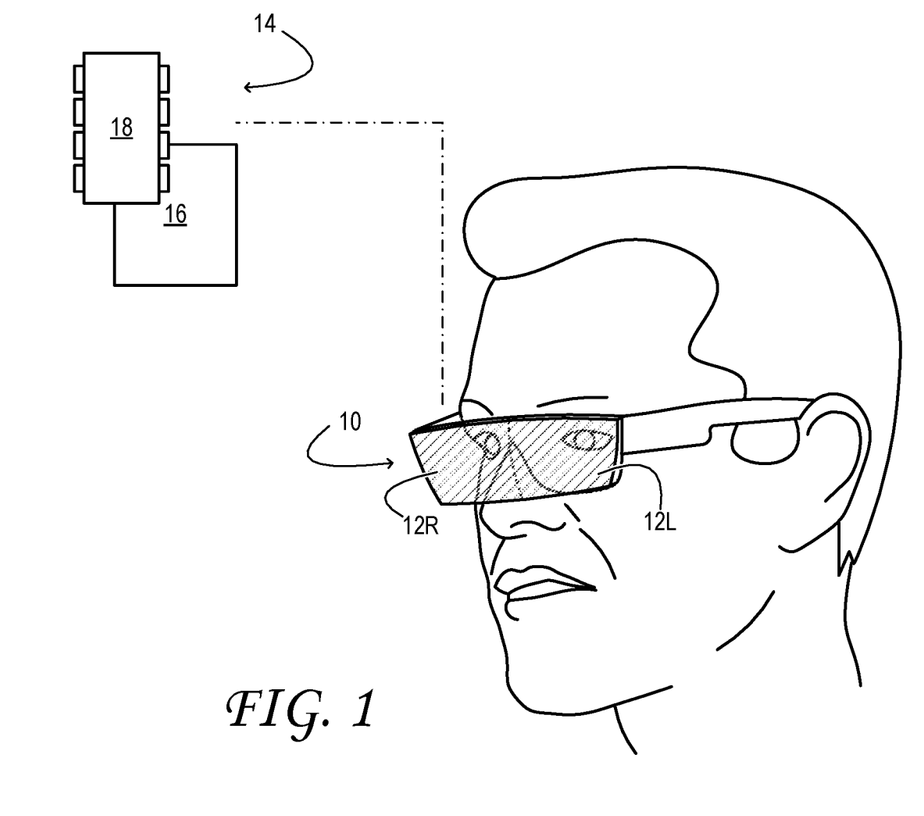
FIG. 1 shows aspects of an example near-eye display system.

FIG. 1 shows aspects of an example near-eye display system 10. The illustrated display system is a binocular display system; it employs a complementary pair of scanned-beam displays 12—viz., right-eye display 12R and left-eye display 12L. In other examples, a single scanned-beam display may be used for both eyes. Display system 10 includes an integrated computer system 14. Operatively coupled to the scanned-beam displays and to other display-system componentry, the computer system includes a logic system 16 and associated computer memory 18. The logic system and computer memory may be configured to render display images provided to the right and left scanned-beam displays, and to enact any processing and control function disclosed herein. It will be noted that the display images formed by the right and left scanned-beam displays need not be identical, but may exhibit a controlled positional disparity in the virtual imagery therein, so as to create a 3D stereo effect.

Figure 2:
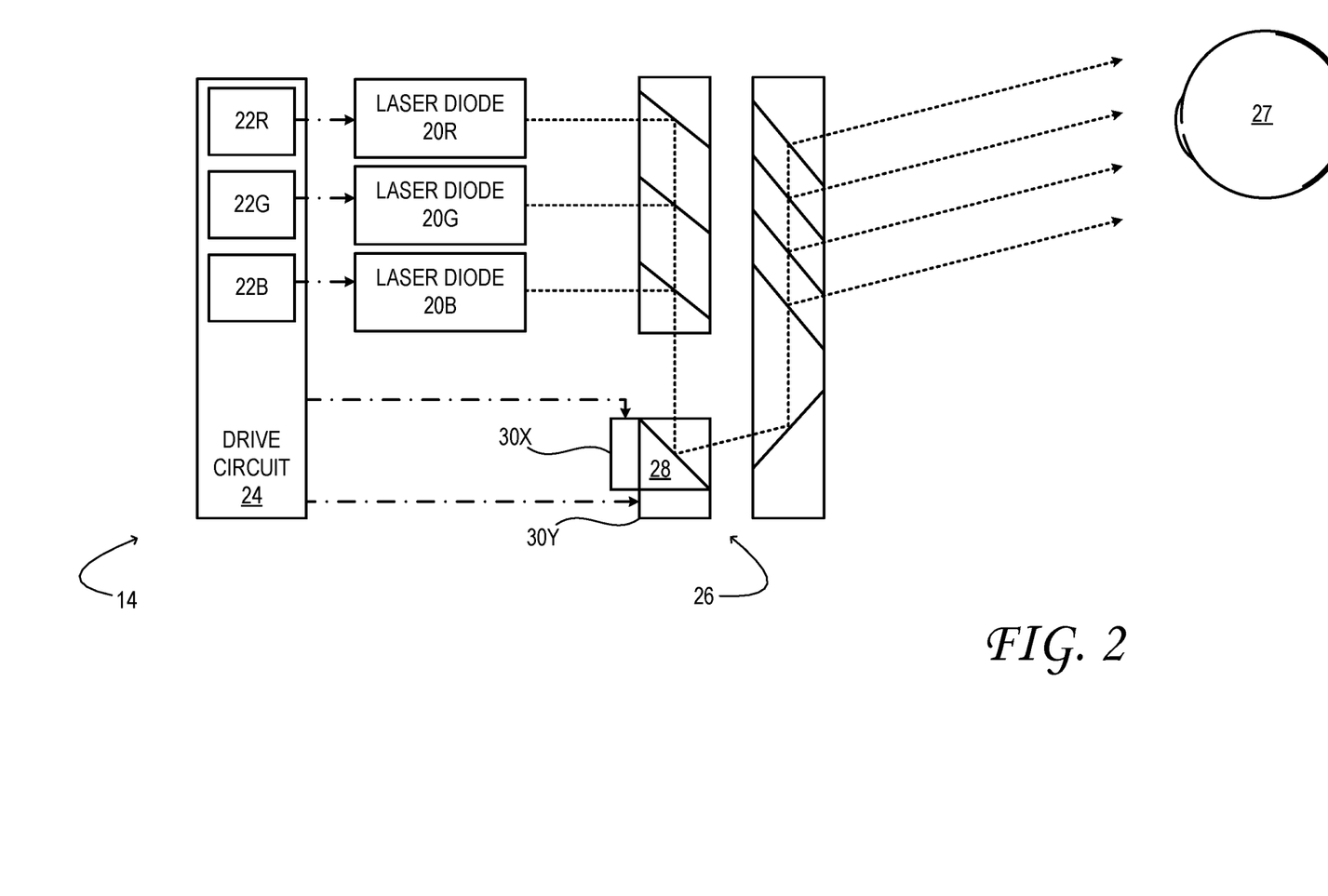
FIG. 2 shows aspects of an example scanned-beam display of a near-eye display system.

FIG. 2 shows aspects of an example scanned-beam display 12. Scanned-beam display 12 is a color display; it includes three laser diodes 20—a red-emitting laser diode 20R, a green-emitting laser diode 20G, and a blue-emitting laser diode 20B. In a monochrome display, a single laser diode may be sufficient. Each laser diode 20 of display 12 is coupled operatively to an associated driver 22 that provides electrical bias to the laser diode pursuant to a control signal from computer system 14. Taken together, each laser diode and associated driver comprise a modulated light source. In the illustrated example, drivers 22R, 22G, and 22B are incorporated into a integrated drive circuit 24 configured to provide shared timing among the drivers, and other control functions.

In scanned-beam display 12, a coherent, collimated beam from each laser diode 20 is received by an active optic 26. The active optic is configured to redirect the beam along a moving axis that scans across and down the field of view (FOV) of the user's right or left pupil 27. More particularly, drive circuit 24 is configured to modulate control of the active optic and to synchronously modulate the current drawn through each of the diode lasers, such that the desired display imagery is formed in the FOV.

In the illustrated example, active optic 26 includes a microelectromechanical system (MEMS) mirror 28. The mirror is coupled to a pair of piezoelectric transducers 30. Transducer 30X controls the deflection of the mirror in a first direction; transducer 30Y controls the deflection of the mirror in a second direction, perpendicular to the first. Drive circuit 24 provides electrical bias to transducers 30 pursuant to a control signal from computer system 14. Through appropriate control of the transducers, mirror 28 is made to raster the beams of the laser diodes across and down the user's FOV. As the beams reach a given point (X, Y) in the FOV, the current applied to the red-, green- and blue-emitting laser diodes may be adjusted so as to achieve the desired brightness and color for that point. This control feature is enacted continuously as the beams scan through the user's FOV, or through a predetermined portion thereof. In this manner, the control signals provided to each laser diode 20 and transducer 30 define the color display image formed in the FOV.

The skilled reader will appreciate that the term 'raster' is not meant to imply that the laser beams necessarily scan a complete horizontal row of the FOV before descending to an incrementally lower row. Rather, the control signal applied to transducers 30X and 30Y may be such as to achieve a harmonic resonance in mirror 28. In traversing the FOV, the beams may trace out one or more complex trajectories (e.g., Lissajous figures). Provided that the overall deflection of mirror 28 can be measured or predicted at any point in time, a display image may be formed by adjusting the current through each diode laser as a function of the deflection. In some examples, active optic 26 may not include a mirror, but may include one or more transmissive or reflective elements having controllable diffractive properties. Suitable examples include tunable Bragg gratings and liquid-crystal embossed blazed gratings. By modulating the diffractive properties of such elements in real time, a laser beam may be scanned across and down the user's FOV.

Figure 3:
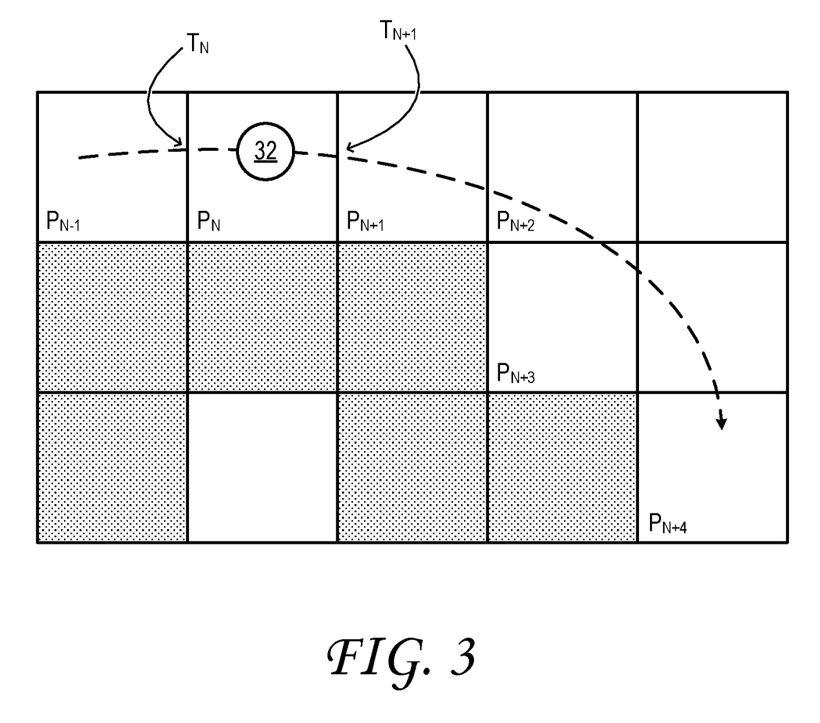
FIG. 3 shows aspects of an example pixel map illustrating synchronous laser-diode emission and beam deflection in a near-eye display system.

FIG. 3 shows aspects of an example pixel map illustrating the manner in which emission from laser diodes 20 may be synchronized to the beam deflection effected by active optic 26. In the illustrated example, beam position 32 (common to all beams, in some examples) crosses the left boundary of pixel $P_N$ at time $T_N$. The emission intensities of the red-, green-, and blue-emitting laser diodes are then adjusted so as to achieve the required brightness and color mixture for pixel $P_N$ in the current image frame. At time $T_{N+1}$, the beam position exits the right boundary of pixel $P_N$ and crosses into pixel $P_{N+1}$. Now the emission intensities are readjusted to achieve the required brightness and color mixture for pixel $P_{N+1}$. Intensity adjustment continues for each pixel that the beam position intersects, and through each successive image frame.

Based on the above mapping, the luminous emission required of a given laser diode 20 to illuminate pixel $P_N$ may be provided in the form of an optical pulse of appropriate integrated power. The optical pulse may be as wide as the time window $\Delta T_{max} = T_{N+1} - T_N$, when beam position 32 is within the boundaries of pixel $P_N$. Irrespective of the detailed trajectory of the beam position as it traverses the FOV, the average time window is inversely proportional to the horizontal and vertical resolutions of the display-image frame and to the frame refresh rate. At a refresh rate of 60 Hertz and a 1968×1280 display resolution, for instance, the time window $\Delta T_{max}$ may be as short as 4.5 nanoseconds (ns) at the center of the image frame. Accordingly, a precisely timed emission pulse of such width may be required of laser diode 20 in scanned-beam applications.

Figure 4:
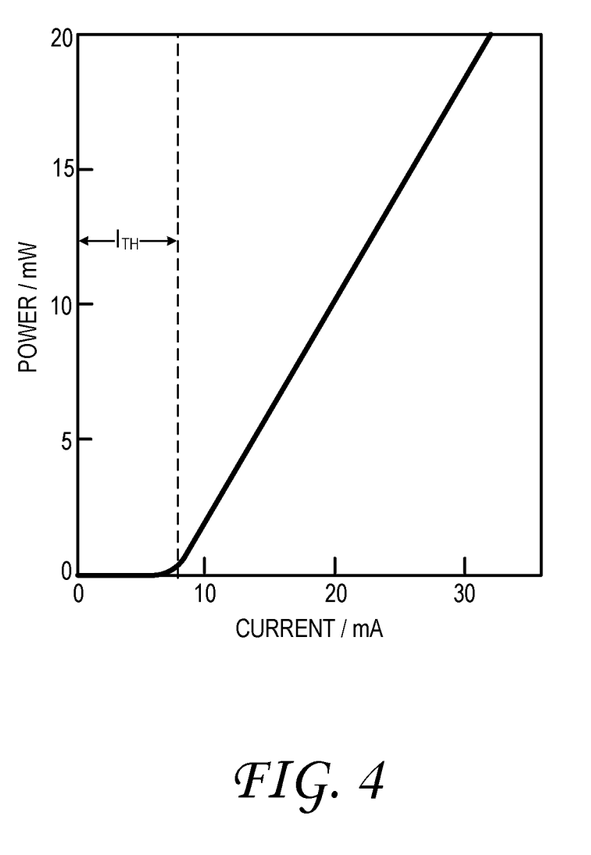
FIG. 4 is a plot of experimentally measured luminous output power of a laser diode versus current.
Figure 5:
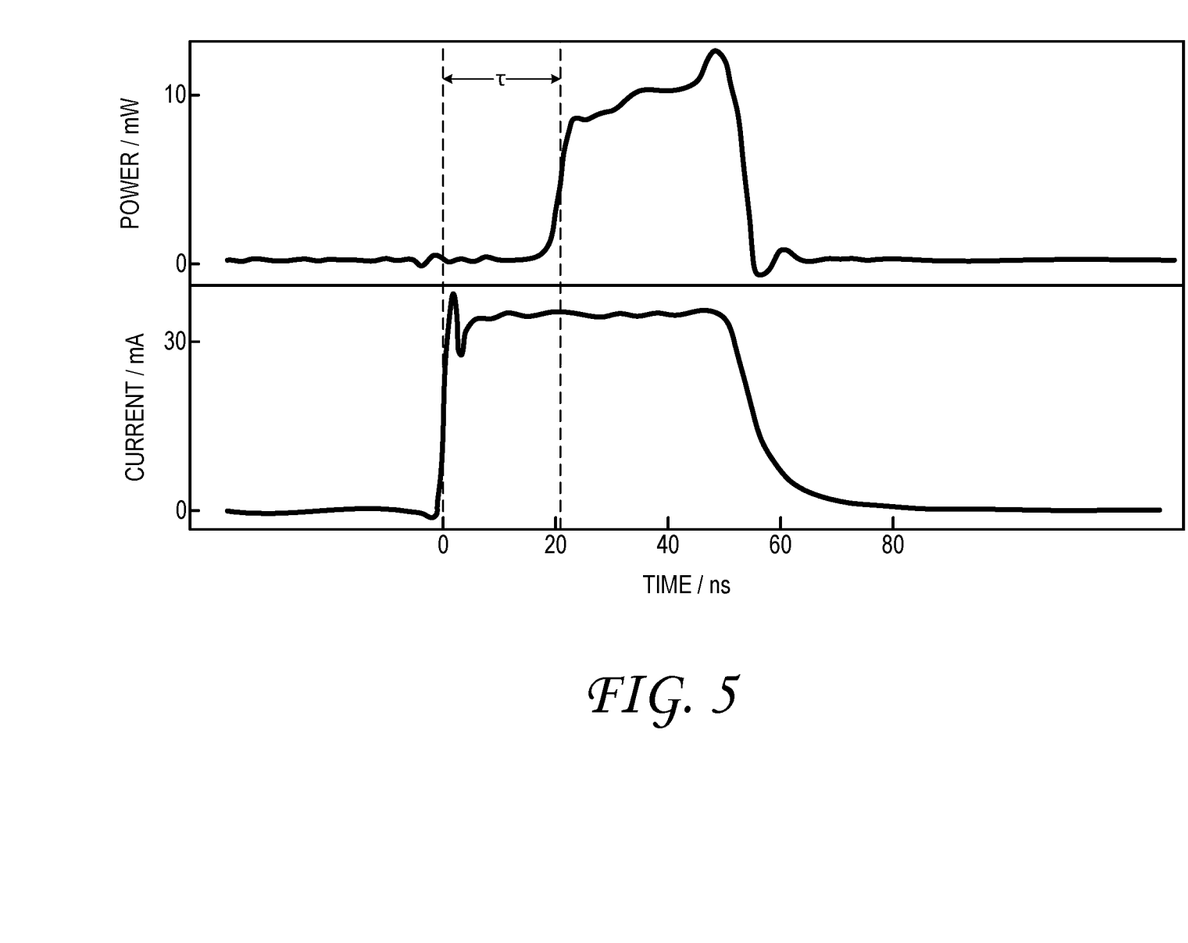
FIG. 5 shows simultaneously recorded traces of current and luminous output power of a laser diode versus time.
Figure 6:
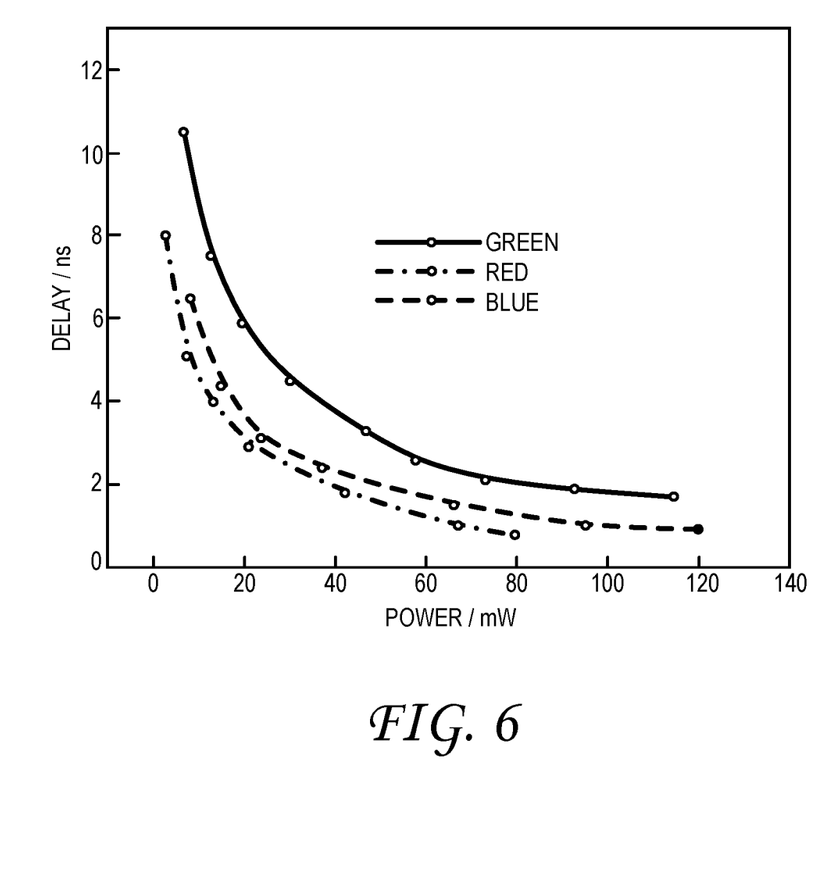
FIG. 6 is a plot of experimentally measured accumulation periods for red-, green-, and blue-emitting laser diodes versus current.

Stimulated emission from a laser diode may occur when a current $I_L$, greater than a threshold current $I_{TH}$, is drawn through the laser diode. FIG. 4 demonstrates this characteristic for an example green-emitting laser diode 20G. Similar characteristics are observed for other laser diodes, but with variations in $I_{TH}$ and in the slope of the output power output as a function of $I_L > I_{TH}$. However, as FIG. 5 shows, the stimulated emission does not commence promptly upon passage of the above-threshold current pulse. The simultaneously acquired current and luminous power traces of FIG. 5 show the effect of driving a 55 ns current pulse of 35 mA through the example green-emitting laser diode. In this example, stimulated emission commences following an accumulation period τ, which lasts about 21 ns. The plot of FIG. 6 demonstrates that the accumulation period τ is not a constant for a given laser diode, but decreases with increasing current applied during the current pulse. Analogous behavior is observed for red-, green-, and blue-emitting laser diodes, but with variations due to inequivalent values of the threshold current $I_{TH}$, and other factors.

The characteristics developed in FIGS. 3 through 6 expose a problem in using laser diodes 20 for high-resolution, scanned-beam image display. In sum, a laser diode will emit stimulated emission (i.e., lase) upon passage of an above-threshold current $I_L > I_{TH}$ for an accumulation period τ, which itself is a function of $I_L$. As noted above, the available time window $\Delta T_{max}$ to brighten or color a pixel $P_N$ is defined by the residence time of the beam position within the boundaries of that pixel. The effective time window is shortened, however, by the accumulation period τ that must precede any emission. As the effective time window $\Delta T_{max} - \tau$ closes, a pulse of increasingly high power is needed in order to supply the required luminance during the $\Delta T_{max}$ interval. In this regime, pixel $P_N$ may appear compressed and offset in the direction of scanning. More significantly, if the available time window is so short as to coincide with the accumulation period ($\Delta T_{max} = \tau$), then no illumination of pixel $P_N$ will be possible within the available time window.

Without tying this disclosure to a particular theory, it is believed that the observed accumulation period τ corresponds to the time required to accumulate an inverted charge-carrier population within the cavity of laser diode 20, at the level of the applied current $I_L$, and generate a sufficient number of photons through stimulated emission to generate laser light that is coupled out of the laser cavity. Through detailed experimentation, however, the inventors herein have determined that an inverted charge-carrier population will also accumulate to some degree at other levels of applied current—both above and below the threshold current $I_{TH}$. Some of the results of this experimentation and/or theorization are summarized in FIGS. 7A, 7B, and 7C.

Figure 7A:
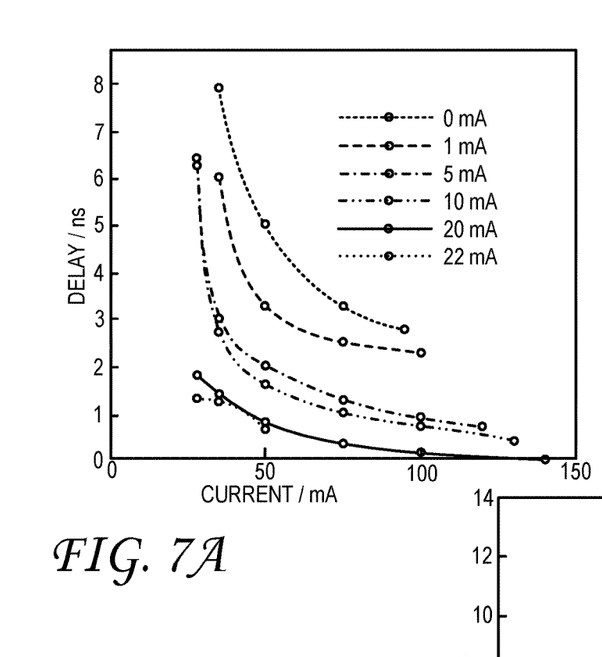
FIGS. 7A, 7B, and 7C show plots of experimentally measured shortened accumulation periods for red-, green-, and blue-emitting laser diodes versus steady-state priming current applied prior to an above-threshold current pulse.
Figure 7B:
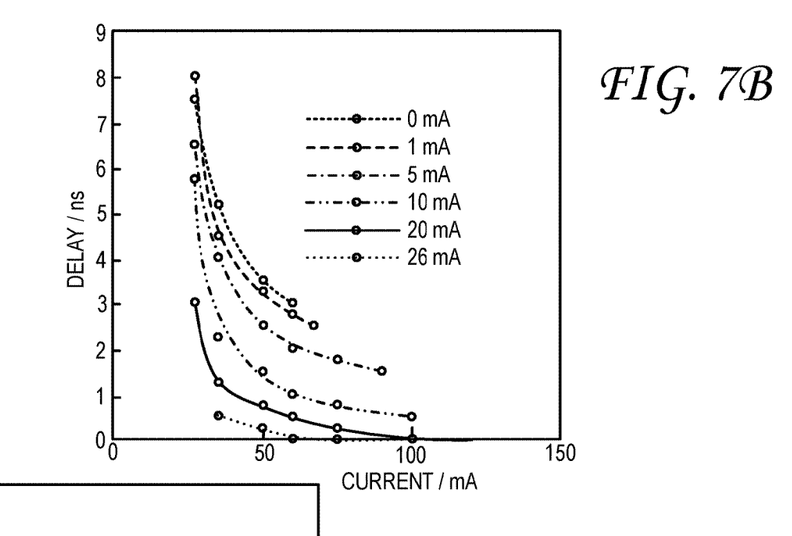
Figure 7C:
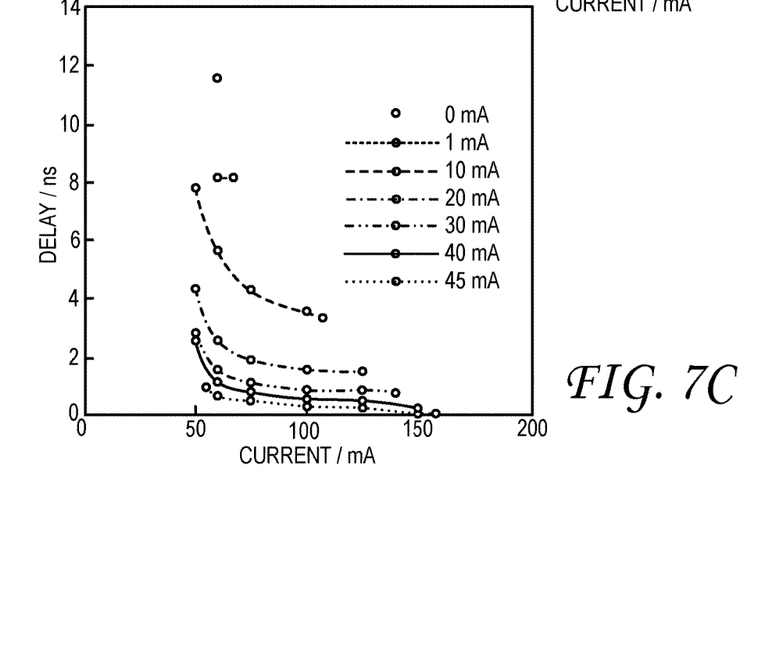

FIG. 7A shows a plot of experimentally measured shortened accumulation periods (turn-on delay) for an example red-emitting laser diode having an $I_{TH}$ of 24 mA. The accumulation periods are plotted versus the steady-state priming current applied prior to an above-threshold current pulse. FIG. 7B shows an analogous plot for an example blue-emitting laser diode having an $I_{TH}$ of 27 mA. FIG. 7C shows an analogous plot for an example green-emitting laser diode having an $I_{TH}$ of 46 mA.

Figure 8:
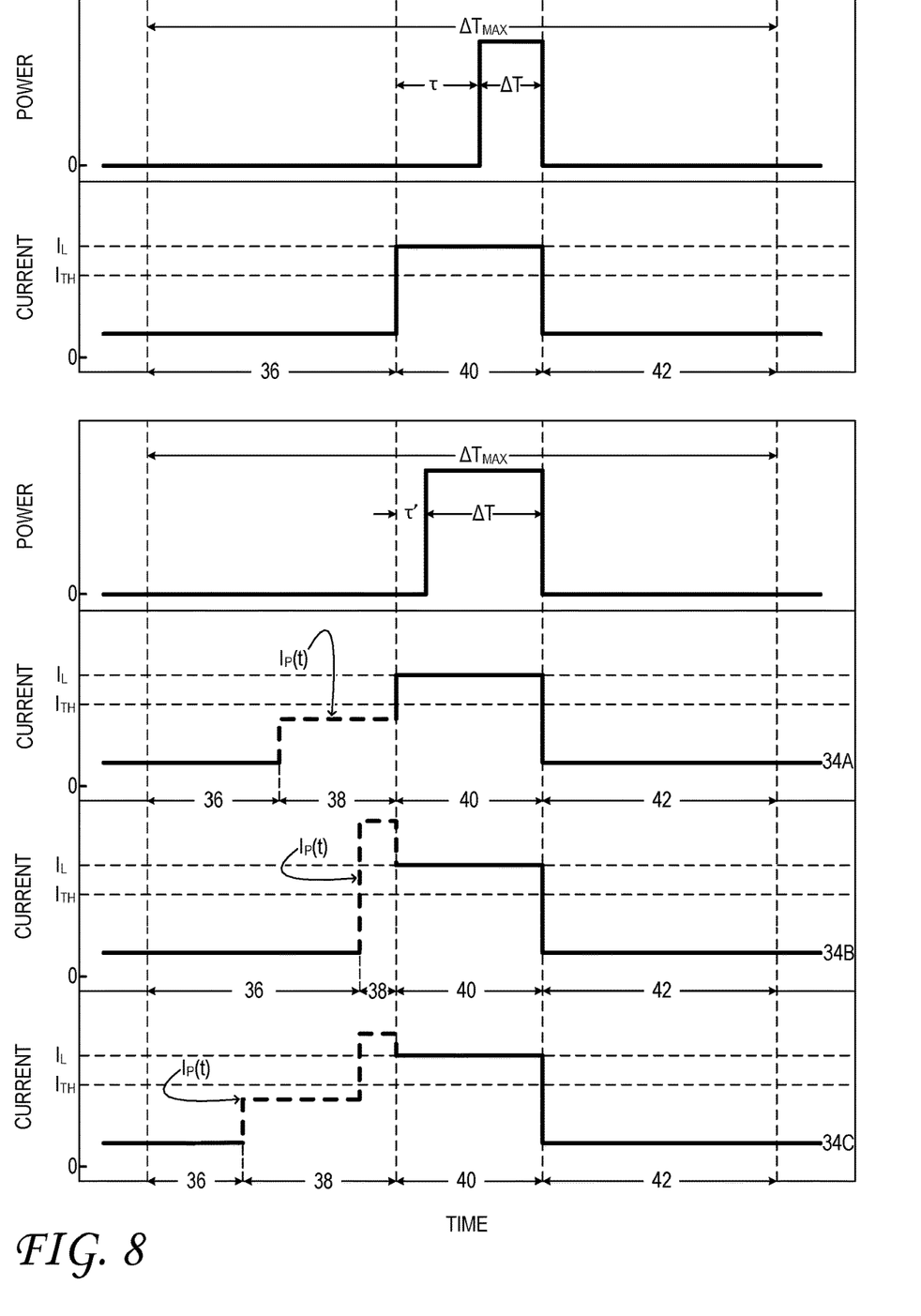
FIGS. 8 and 9 show aspects of an example drive modes configured to shorten the accumulation period required for stimulated emission from a laser diode.

The lower four timing diagrams of FIG. 8 show aspects of priming drive mode configured to shorten the accumulation period t required for stimulated emission from laser diode 20. Driven in this manner, the laser diode can be made to release stimulated emission laser pulses within a narrow time window $\Delta T_{max}$, as required for illumination of a pixel $P_N$ in a high-resolution, scanned-beam display. In FIG. 8, the priming drive mode is compared to an unprimed drive mode, shown in the upper two timing diagrams.

In the priming drive mode of FIG. 8, the current drawn through laser diode 20 over time window $\Delta T_{max}$ is defined by a current waveform, of which two discrete variants are shown—current waveform 34A and current waveform 34B. In some examples, a current waveform may repeat over one or more subsequent time windows—e.g., windows during which the beam position intersects neighboring pixels. In some examples, the current waveform may repeat, but with one or more variations in the parameters enumerated herein.

In some examples, an entirely different current waveform may define the current in the time window preceding or following time window $\Delta T_{max}$—e.g., a pulse sequence not particularly configured to shorten the accumulation period. For ease of illustration, FIG. 8 does not show the effects of nonzero inductance or capacitance on current waveforms (e.g., current waveform 34A and/or current waveform 34B), which, in practice, would reduce the slope of the current and may cause ringing.

Each current waveform may include a stand-by period 36, a priming period 38, a lasing period 40, and a relaxation period 42. During lasing period 40, an above-threshold current pulse is drawn through laser diode 20 for such time as to achieve stimulated emission. The stimulated emission persists during an interval $\Delta T$, which lies within the available time window $\Delta T_{max}$ for illumination of pixel $P_N$ at the current beam position. Integrated over the interval $\Delta T$, the emission from laser diode 20 provides the required luminance for the pixel, in the color channel of the laser diode.

During priming period 38, a priming current $I_p(t)$ is drawn through laser diode 20. The priming current is not sufficient to cause the laser diode to lase during the priming period. However, the priming current is sufficient to shorten the accumulation period t relative to the value observed for the laser diode in the unprimed state. In other words, application of priming current $I_p(t)$ reduces the latency of stimulated emission during lasing period 40, when above-threshold current $I_L$ is applied to the laser diode. The symbol $\tau'$ will denote the shortened accumulation period as a result of priming. It will be noted that the shortened accumulation period $\tau'$ is a function not only of the above-threshold current $I_L$ applied during the lasing period 40, but also of the priming current $I_p(t)$ applied during priming period 38.

In the illustrated example, priming period 38 of current waveform 34A includes a step to a sub-threshold current. For the duration of this step, priming current $I_p(t)$ stays below the threshold current $I_{TH}$, so stimulated emission does not occur. However, an inverted population of charge carries accumulates to such a degree that the accumulation period t observed during subsequent lasing period 40 is shortened.

Priming period 38 of current waveform 34B includes a step to an above-threshold current. Here, priming current $I_p(t)$ takes the form of an above-threshold priming current pulse. The priming current pulse is too narrow to enable laser diode 20 to lase: in effect, the priming current pulse applied during the above-threshold step is shorter than the accumulation period $\tau$ evaluated at the outset of the above-threshold step, in view of the overall $I_p(t)$. However, the priming current pulse is sufficiently energetic to force charge carriers into the laser cavity, and to begin generating a stimulated emission optical signal, at such a rate as to shorten the accumulation period from $\tau$ to a shortened accumulation period $\tau'$, for subsequent lasing period 40.

Priming period 38 of current waveform 34C includes a first step to a sub-threshold current and a second step to an above-threshold current. Each of the respective priming steps has, in combination, substantially the same effect as described above, but the combination may provide additional synergy. For instance, preceding the above-threshold priming pulse by a sub-threshold step may reduce the amplitude of the pulse required for effective priming. A priming pulse of lower amplitude may be easier to apply, less prone to induce ringing, etc. Moreover, the charge-carrier density accumulated during the priming period may be easier to control via a combination of a longer sub-threshold step and a shorter above-threshold pulse (as the duration of the latter may be challenging to control at the required level of precision).

It will be noted that the current waveforms illustrated herein are provided by way of example, and that various other waveforms are also envisaged. For instance, the first and second steps of current waveform 34C may be reversed in some examples. Non-rectangular current ramps and other waveforms may also be used.

Continuing in FIG. 8, driver 22 is configured, in each example, to draw above-threshold current $I_L$ through the laser diode 20 immediately after priming period 40, thereby triggering emission from the laser diode following the shortened accumulation period $\tau'$. Each of stand-by period 36 and relaxation period 42 may be adjusted in order to shift or center emission interval $\Delta T$ within time window $\Delta T_{max}$. Sub-threshold current—less than $I_p(t)$, in some examples—may be drawn through the laser diode during the stand-by and relaxation periods in order to soften the current transients associated with priming period 38 and lasing period 40. In other examples, the current may be reduced to zero during one or both of the stand-by and relaxation periods. In still other examples, one or both of the stand-by and relaxation periods may be omitted.

As noted above, the length of shortened accumulation period $\tau'$ (and therefore the timing of emission interval $\Delta T$) depends not only on the priming current $I_p(t)$, but also on the current $I_L$ applied during the lasing period. In some examples, therefore, driver 22 of diode laser 20 may be configured to vary the priming current $I_p(t)$ based on the anticipated above-threshold lasing current $I_L$. $I_p(t)$ may be reduced with increasing $I_L$ and vice versa, for instance. In some examples, the driver may be configured to vary the length of priming period 38 based on the anticipated above-threshold lasing current. The length may be reduced with increasing $I_L$, and vice versa. It will be noted, however, that the value of the applied current $I_L$ may not be defined uniquely by the luminance requirement for any pixel—because the same luminance can be supplied in a narrow, intense pulse or in a broader, weaker pulse. Accordingly, both the priming current $I_p(t)$ and the characteristics of the emission current pulse (amplitude and duration) may be optimized together in order to arrive at a desirable timing control scheme for scanned-beam display 12.

The various parameters of the drive mode of FIG. 8—the lengths of the various periods and current drawn within each period—may be adjusted in order to optimize one or more figures of merit of scanned-beam display 12. Such figures of merit include the display resolution as determined by the minimum achievable $\Delta T$, display quality in terms of the extent to which $\Delta T$ is able to fill the $\Delta T_{max}$ window, and power efficiency as affected by the amount of power dissipated by laser diodes 20 during periods in which no light is emitted.

The reader will observe, from the timing diagrams of FIG. 8, that the drive modes there illustrated provide an advantage in any regime in which the accumulation period is shortened by more than the length of the priming period. However, this is by no means the only regime in which the illustrated drive modes are useful. The timing diagrams of FIG. 9 illustrate an alternative scenario.

Figure 9:
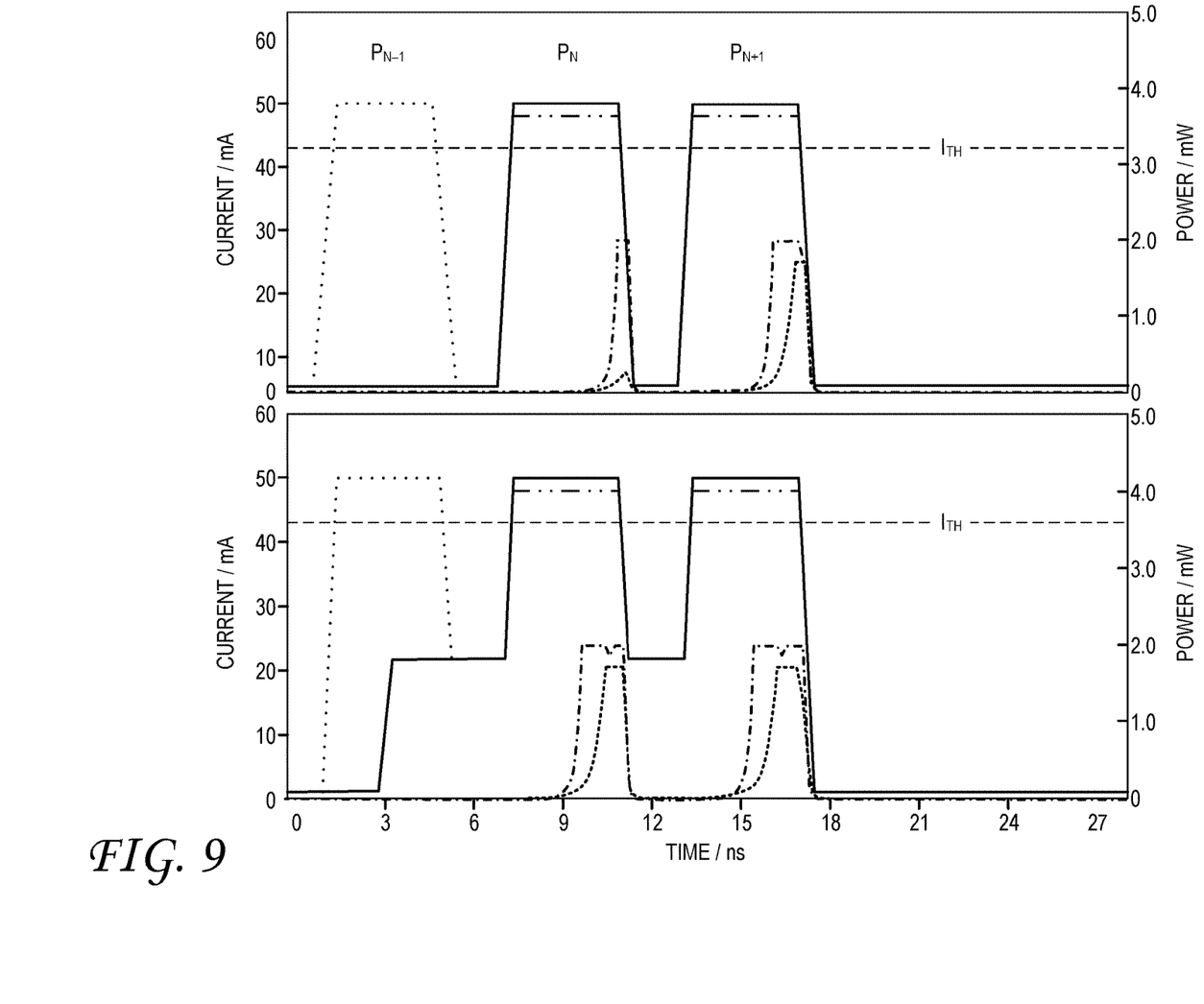

The upper diagram of FIG. 9 shows overlapping drive current and optical output power for a simulated unprimed drive mode of a laser diode. The dotted line extends over a window $\Delta T_{max}$ in which no output power is desired. During this window, the beam position may scan over a pixel intended to be dark, for instance. Following the first time window are second and third time windows in which equal, nonzero optical output is desired. Drive current is plotted for strong- and weak-output conditions over both windows. In FIG. 9, drive current corresponding to the strong output is shown as a solid line; drive current corresponding to the weak output is shown as a double-dot dashed line.

The simulated strong-output power is shown as a dot-dashed line, and the simulated weak-output power is shown as a dashed line. For both levels of output power—intended to be the same for the second and third windows—the predicted output power in the second window is lower than in the third. The inequality is more pronounced for the weak output case, where the illumination is practically nonexistent.

The lower diagram of FIG. 9 represents an otherwise equivalent simulation, but one in which a four-nanosecond sub-threshold priming step is applied in advance of the second time window. In this example, the priming period 'reaches back' into the first time window. However, the pixel position corresponding to the first time window remains dark because priming current is lower than the threshold current $I_{TH}$ (43 mA in the example simulation).

A priming step is provided also for the third pixel position. Here, the priming period reaches back into the second time window. In the illustrated scenario, the accumulation period for the second pixel position is shortened from 10.9 to 9.7 ns (a difference of 1.2 ns); this degree of shortening was achieved with 22 mA priming current during a 4 ns priming period. The advantageous effect is that the integrated output power is more nearly equal, both for the strong- and weak-output cases. The positioning of the emitted light relative to the raster-scanned pixel period is also nearly equal.

The example of FIG. 9 demonstrates that an overall benefit may be achieved even when the accumulation period is shortened by less than the priming period for a given pixel position $P_N$. In this case, the combined priming period 38 and lasing period 40 may have a duration greater than the time window $\Delta T_{max}$ for $P_N$. In effect, the priming period may reach back into the time window of previously scanned pixel position $P_{N-1}$. If $P_{N-1}$ is intended to be dark, then it remains dark because the priming pulse is too weak or narrow to achieve lasing. If $P_{N-1}$ is intended to be bright, then the priming period/current for $P_N$ is merely subsumed into the lasing period/current for $P_{N-1}$. In practice, therefore the timing control scheme referenced hereinabove may be configured to 'look back' at the output level of $P_{N-1}$ in order to determine the desired priming current $I_p(t)$, if any, to be applied for a given $P_N$.

One aspect of this disclosure is directed to a scanned-beam display, comprising: a laser diode configured to lase upon passing an above-threshold current for an accumulation period; an active optic configured to receive and redirect lasing emission from the laser diode; and, coupled operatively to the laser diode and to the active optic, a drive circuit configured to: draw a priming current through the laser diode over a priming period, the priming current being insufficient to cause the laser diode to lase during the priming period, but sufficient to shorten the accumulation period, after the priming period, draw the above-threshold current through the laser diode, thereby triggering emission from the laser diode following a shortened accumulation period, and modulate control of the active optic in synchronicity with the priming and above threshold currents drawn through the laser diode, such that the emission from the laser diode is redirected along a moving axis to form a display image.

In some implementations, the accumulation period is shortened by more than the priming period. In some implementations, the priming current is below a threshold current for stimulated emission from the laser diode. In some implementations, the priming current is above a threshold current for stimulated emission from the laser diode, and the priming period is too short to enable the laser diode to lase. In some implementations, the priming current is below a threshold for stimulated emission from the laser diode during a first portion of the priming period, and above the threshold current for a second portion of the priming period. In some implementations, the laser diode is one of a plurality of laser diodes differing in emission wavelength and coupled operatively to the drive circuit, and the active optic is configured to receive and redirect lasing emission from each of the laser diodes. In some implementations, the accumulation period differs among the plurality of laser diodes. In some implementations, the active optic includes a mirror. In some implementations, the active optic includes an electronically controllable scanning mirror. In some implementations, the emission from the laser diode is scanned across a field of view of a viewer of the scanned-beam display.

Another aspect of this disclosure is directed to a modulated light source comprising: a laser diode configured to lase upon passing an above-threshold current for an accumulation period; coupled operatively to the laser diode, a drive circuit configured to: draw a priming current through the laser diode over a priming period, the priming current being insufficient to cause the laser diode to lase during the priming period, but sufficient to shorten the accumulation period, and after the priming period, draw the above-threshold current through the laser diode, thereby triggering emission from the laser diode following a shortened accumulation period, wherein the accumulation period is shortened by more than the priming period.

In some implementations, the priming current is below a threshold current for stimulated emission from the laser diode. In some implementations, the priming current is above a threshold current for stimulated emission from the laser diode, but the priming period is too short to enable the laser diode to lase. In some implementations, the drive circuit is configured to drawn less than the priming current through the laser diode after emission. In some implementations, the above-threshold current is drawn immediately after the priming period. In some implementations, the drive circuit is configured to vary the priming current based on the above-threshold current. In some implementations, the drive circuit is configured to vary the priming period based on the above-threshold current.

Another aspect of this disclosure is directed to a modulated light source comprising: a laser diode configured to lase upon passing an above-threshold current for an accumulation period; coupled operatively to the laser diode, a drive circuit configured to: draw an above-threshold priming current pulse through the laser diode, the priming current pulse being too narrow to cause the laser diode to lase, but sufficient to shorten the accumulation period, and after the priming current pulse, draw an above-threshold emission current pulse through the laser diode, thereby triggering emission from the laser diode following a shortened accumulation period, wherein the accumulation period is shortened by more than the priming period.

In some implementations, the drive circuit is configured to vary the above-threshold current of the priming current pulse based on an amplitude of the emission current pulse. In some implementations, the drive circuit is configured to vary a width of the priming current pulse based on an amplitude of the emission current pulse.

It will be understood that the configurations and/or approaches described herein are exemplary in nature, and that these specific examples or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A scanned-beam display, comprising:
a laser diode configured to lase upon passing an above-threshold current for an accumulation period;
an active optic configured to receive and redirect lasing emission from the laser diode; and coupled operatively to the laser diode and to the active optic, a drive circuit configured to:
draw a priming current through the laser diode over a priming period, the priming current being insufficient to cause the laser diode to lase during the priming period, but sufficient to shorten the accumulation period,
after the priming period, draw the above-threshold current through the laser diode, thereby triggering emission from the laser diode following a shortened accumulation period, and
modulate control of the active optic in synchronicity with the priming and above-threshold currents drawn through the laser diode, such that the emission from the laser diode is redirected along a moving axis to form a display image.

2. The scanned-beam display of claim 1 wherein the accumulation period is shortened by more than the priming period.

3. The scanned-beam display of claim 1 wherein the priming current is below a threshold current for stimulated emission from the laser diode.

4. The scanned-beam display of claim 1 wherein the priming current is above a threshold current for stimulated emission from the laser diode, and the priming period is too short to enable the laser diode to lase.

5. The scanned-beam display of claim 1 wherein the priming current is below a threshold for stimulated emission from the laser diode during a first portion of the priming period, and above the threshold current for a second portion of the priming period.

6. The scanned-beam display of claim 1 wherein the laser diode is one of a plurality of laser diodes differing in emission wavelength and coupled operatively to the drive circuit, and wherein the active optic is configured to receive and redirect lasing emission from each of the laser diodes.

7. The scanned-beam display of claim 6 wherein the accumulation period differs among the plurality of laser diodes.

8. The scanned-beam display of claim 1 wherein the active optic includes a mirror.

9. The scanned-beam display of claim 1 wherein the active optic includes an electronically controllable scanning mirror.

10. The scanned-beam display of claim 1 wherein the emission from the laser diode is scanned across a field of view of a viewer of the scanned-beam display.

11. Enacted in a drive circuit of a scanned-beam display, wherein a laser diode and an active optic are coupled operatively to the drive circuit, wherein the laser diode is configured to lase upon passing an above-threshold current for an accumulation period, and wherein the active optic is configured to receive and redirect lasing emission from the laser diode, a method to operate the scanned-beam display, the method comprising:
drawing a priming current through the laser diode over a priming period, the priming current being insufficient to cause the laser diode to lase during the priming period, but sufficient to shorten the accumulation period;
after the priming period, drawing the above-threshold current through the laser diode, thereby triggering emission from the laser diode following a shortened accumulation period; and
modulating control of the active optic in synchronicity with the priming and above-threshold currents drawn through the laser diode, such that the emission from the laser diode is redirected along a moving axis to form a display image.

12. The method of claim 11 wherein the accumulation period is shortened by more than the priming period.

13. The method of claim 11 wherein the priming current is below a threshold current for stimulated emission from the laser diode.

14. The method of claim 11 wherein the priming current is above a threshold current for stimulated emission from the laser diode, and the priming period is too short to enable the laser diode to lase.

15. The method of claim 11 wherein the priming current is below a threshold for stimulated emission from the laser diode during a first portion of the priming period, and above the threshold current for a second portion of the priming period.

16. The method of claim 11 wherein the laser diode is one of a plurality of laser diodes differing in emission wavelength and coupled operatively to the drive circuit, and wherein the active optic is configured to receive and redirect lasing emission from each of the laser diodes.

17. The method of claim 16 wherein the accumulation period differs among the plurality of laser diodes.

18. The method of claim 11 wherein the active optic includes a mirror.

19. The method of claim 11 wherein the active optic includes an electronically controllable scanning mirror.

20. The method of claim 11 further comprising scanning the emission from the laser diode across a field of view of a viewer of the scanned-beam display.

* * * * *